(12) United States Patent
Fang et al.

(10) Patent No.: US 6,737,353 B2
(45) Date of Patent: May 18, 2004

(54) SEMICONDUCTOR DEVICE HAVING BUMP ELECTRODES

(75) Inventors: Jen Kuang Fang, Kaohsiung (TW); Ching Hua Chiang, Changhua (TW); Shih Kuang Chen, Kaohsiung (TW); Chau Fu Weng, Tainan (TW)

(73) Assignee: Advanced Semiconductor Engineering, Inc., Kaoshiung (TW)

( * ) Notice: Subject to any disclaimer, the term of this patent is extended or adjusted under 35 U.S.C. 154(b) by 4 days.

(21) Appl. No.: 09/883,216

(22) Filed: Jun. 19, 2001

(65) Prior Publication Data

US 2002/0190395 A1 Dec. 19, 2002

(51) Int. Cl.7 .......................... H01L 21/44; H01L 23/48
(52) U.S. Cl. ...................... 438/652; 438/613; 438/614; 438/650; 438/653; 438/654; 438/656; 438/642; 438/643; 438/644; 438/683; 438/685; 438/704; 257/737; 257/750; 257/761; 257/763; 257/766
(58) Field of Search .................. 438/613, 614, 438/652–654, 656, 642–644, 650, 683, 685, 704; 257/737, 750, 761, 763, 766

(56) References Cited

U.S. PATENT DOCUMENTS

| | | | | |
|---|---|---|---|---|
| 3,599,060 A | * | 8/1971 | Triggs | 317/234 R |
| 4,922,322 A | * | 5/1990 | Mathew | 357/69 |
| 5,492,235 A | * | 2/1996 | Crafts et al. | 216/13 |
| 5,631,499 A | * | 5/1997 | Hosomi et al. | 257/737 |
| 5,693,565 A | * | 12/1997 | Camilletti et al. | 437/192 |
| 6,312,830 B1 | * | 11/2001 | Li et al. | 428/624 |
| 6,417,089 B1 | * | 7/2002 | Kim et al. | 438/612 |
| 6,426,556 B1 | * | 7/2002 | Lin | 257/738 |
| 6,452,270 B1 | * | 9/2002 | Huang | 257/738 |
| 6,462,426 B1 | * | 10/2002 | Kelkar et al. | 257/781 |

\* cited by examiner

*Primary Examiner*—Eddie Lee
(74) *Attorney, Agent, or Firm*—Lowe Hauptman Gilman & Berner LLP

(57) ABSTRACT

A semiconductor device having a bump electrode comprising a substrate having a dielectric layer formed thereon, an aluminum contact pad on the substrate wherein at least a portion of the aluminum contact pad is exposed through the dielectric layer on the substrate. The aluminum contact pad is provided with an under bump metallurgy including a aluminum layer formed on the exposed portion of the aluminum contact pad, a nickel-vanadium layer formed on the aluminum layer and a titanium layer formed on the nickel-vanadium layer. A gold bump formed on the titanium layer acts as the bump electrode.

5 Claims, 6 Drawing Sheets

SEMICONDUCTOR DEVICE HAVING BUMP ELECTRODES

BACKGROUND OF THE INVENTION

1. Field of the Invention

This invention relates to the electronic assembly technology and more specifically to the semiconductor device having bump electrodes.

2. Description of the Related Art

As electronic devices have become more and more smaller and thinner, the velocity and the complexity of IC chips have become more and more higher. Accordingly, a need has arisen for higher package efficiency. Demand for miniaturization is the primary catalyst driving the usage of advanced packages such as tape carrier package (TCP). TCP is commonly used in the manufacture of liquid crystal display modules. These liquid crystal displays provide the advantages of low cost, high reliability, high-density storage, light weight, and low power consumption. The tape carrier package generally comprises a semiconductor device having bump electrodes. Moreover, the semiconductor device having bump electrodes are also used in chip on glass (COG) technology, which permits direct attachment of chips to a glass substrate.

Bumping method typically comprises the steps of (a) forming under bump metallurgy (UBM) on bonding pads of the semiconductor device, and (b) forming metal bumps on the UBM. Usually, gold is chosen as the material of metal bumps for meeting the requirements of proceeding TCP or COG process. Typically, the UBM adapted for gold bumps consists of three metal layers, including: (a) adhesion layer (formed of Al or Cr) for providing a good adhesion to Al pad and passivation layer; (b) barrier layer (formed of Cu, Pd or Pt) for preventing chip contact pad and metal bump from reacting with each other to generate an intermetallic compound (which is harmful to the reliability of the chips); and (c) wetting layer (formed of Au).

FIG. 1 is a cross sectional view of a conventional semiconductor device 10 having a bump electrode. An aluminum contact pad 11 is formed on a substrate 12 of a semiconductor integrated circuit. The substrate 12 comprises a plurality of resistances, capacities and inductors of input/output units (I/Os). A passivation film 13, serving as an insulation film, is formed on the entire surface of the substrate 12. A passivation opening section which is formed at a predetermined position, is formed to expose the aluminum contact pad 11. The semiconductor device 10 has a UBM 14 consisting of three metal layers, including: (a) chromium layer 14a (as the adhesion layer); (b) copper layer 14b (as the barrier layer); and (c) gold layer 14c (as the wetting layer). After the multilayers for the UBM are formed over the entire surface of the substrate 12, a gold bump 15 is plated on the UBM 14 through photoresist application and its patterning. Finally, the UBM layers that are not covered by the gold bump 15 are etched away.

FIG. 2 is a cross sectional view of another conventional semiconductor device 20 having a bump electrode. The semiconductor device 10 has a UBM 24 consisting of three metal layers, including: (a) titanium layer 24a (as the adhesion layer); (b) palladium layer 24b (as the barrier layer); and (c) gold layer 24c (as the wetting layer).

FIG. 3 is a cross sectional view of still another conventional semiconductor device 30 having a bump electrode. The semiconductor device 30 has a UBM 34 consisting of three metal layers, including: (a) titanium layer 34a (as the adhesion layer); (b) platinum layer 34b (as the barrier layer); and (c) gold layer 34c (as the wetting layer).

However, all of the prior art UBMs mentioned above comprise a gold layer under the gold bump. Thus, a gold target is required for used in the sputtering process thereby increasing the cost. Furthermore, when an etching process is conducted for patterning the gold layer of the UBM, the gold bump is also etched during the process thereby creating undesired effect on the bump height uniformity and the uniformity of bump surface roughness, which, in turn, adversely affect the quality of the gold bump.

The present invention therefore seeks to provide an under bump metallurgy which overcomes, or at least reduces the above-mentioned problems of the prior art, thereby maintaining the uniformity of the gold bumps.

SUMMARY OF THE INVENTION

It is a primary object of the present invention to provide a semiconductor device having gold bump electrodes wherein the under bump metallurgy adapted for the bump electrode utilizes a titanium layer as the wetting layer thereby replacing the expensive gold layer and acquiring a better etching selectivity.

It is another object of the present invention to provide a semiconductor device having bump electrodes wherein the under bump metallurgy adapted for the bump electrode utilizes nickel-vanadium layer as the barrier layer to reduce the influence of I/Os on the plating process of the gold bump, thereby maintaining the bump height uniformity and the uniformity of bump surface roughness.

The semiconductor device having bump electrodes according to the present invention comprises an aluminum contact pad on a substrate wherein at least a portion of the aluminum contact pad is exposed through a dielectric layer on the substrate. An under bump metallurgy (UBM) is formed on the aluminum contact pad. The under bump metallurgy comprises an aluminum layer formed on the exposed portion of the aluminum contact pad, a nickel-vanadium layer formed on the aluminum layer and a titanium layer formed on the nickel-vanadium layer. A gold bump is provided on the UBM over aluminum contact pad so as to form the bump electrode.

The present invention further provides a method for forming a semiconductor device having a bump electrode. The method comprises (a) providing an aluminum contact pad on a semiconductor substrate, at least a portion of the aluminum contact pad being exposed through a dielectric layer on the substrate; (b) forming an aluminum layer on the dielectric layer and the portion of the aluminum contact pad exposed through the dielectric layer; (c) forming a nickel-vanadium layer on the aluminum layer; (d) forming a titanium layer on the nickel-vanadium layer; (e) cleaning the titanium layer with a cleaning medium; (f) selectively plating a gold bump on the titanium layer at a location corresponding to the aluminum contact pad; and (g) etching the aluminum layer, the nickel-vanadium layer and the titanium layer with the gold bump as a mask.

According to the present invention, the UBM of the semiconductor device having bump electrodes comprises an aluminum layer, a nickel-vanadium layer and a titanium layer. Since the nickel-vanadium layer with a lower electrical conductivity is utilized as the barrier layer, the influence imposed by I/Os of the semiconductor device during the plating process of the gold bump is significantly reduced, thereby maintaining the bump height uniformity and the uniformity of bump surface roughness. Furthermore, the UBM of present invention utilizes the titanium layer instead of the expensive gold layer as the adhesion layer to reduce the cost. However, the titanium layer may react with the oxygen in air to form an oxidizing layer on the surface thereof, and the oxidizing layer should be removed before proceeding to the plating process of the gold bump so as to assure a good adhesion between the gold bump and the UBM thereby improving electrical performance.

BRIEF DESCRIPTION OF THE DRAWINGS

Other objects, advantages, and novel features of the invention will become more apparent from the following detailed description when taken in conjunction with the accompanying drawings.

DETAILED DESCRIPTION OF THE PREFERRED EMBODIMENT

Figure 1:
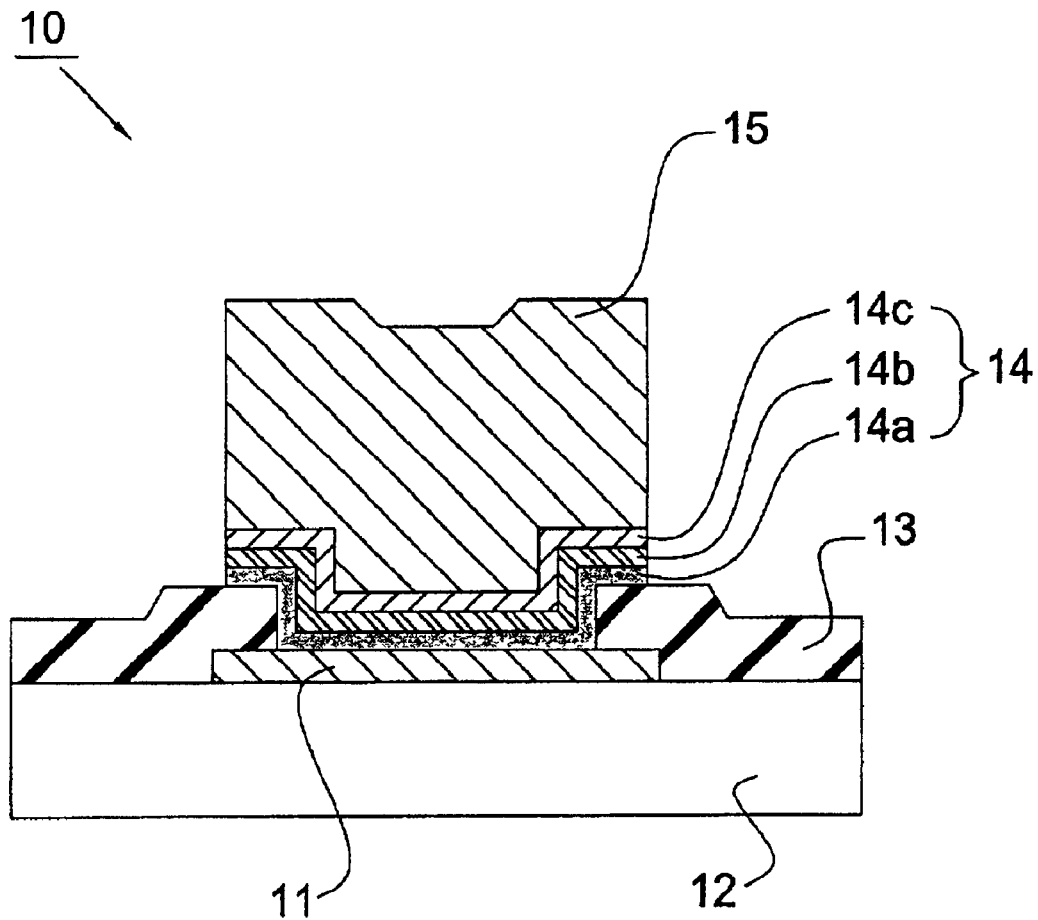
FIG. 1 is a schematic sectional view of a conventional semiconductor device having a bump electrode.
Figure 2:
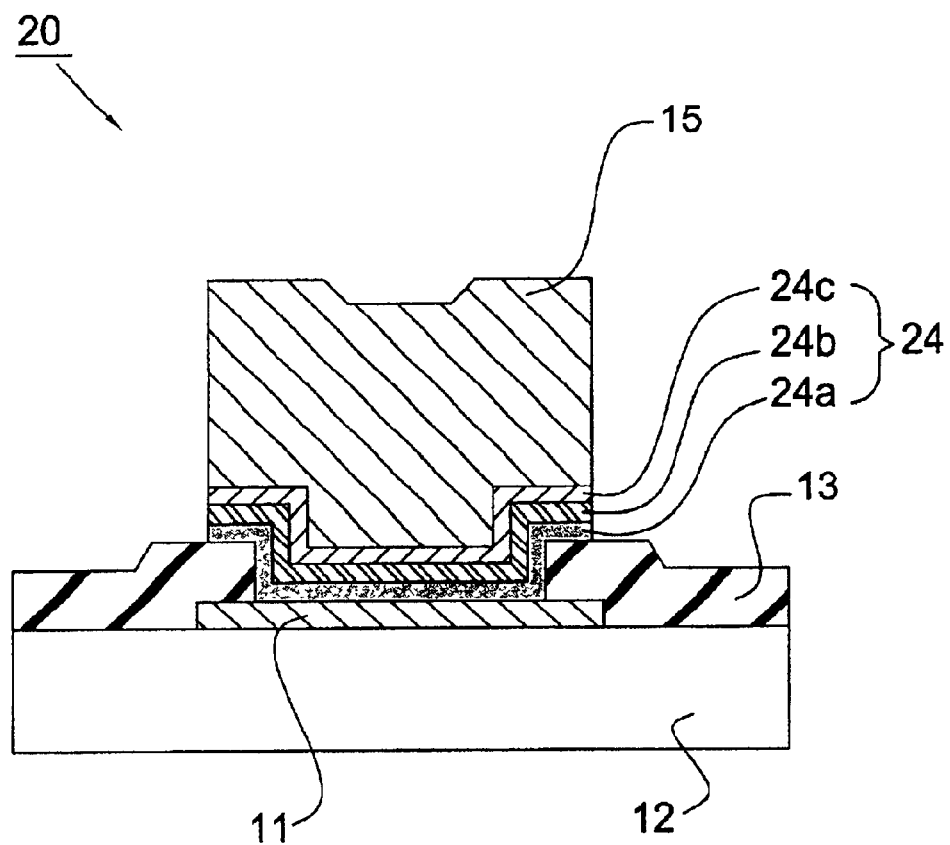
FIG. 2 is a schematic sectional view of another conventional semiconductor device having a bump electrode.
Figure 3:
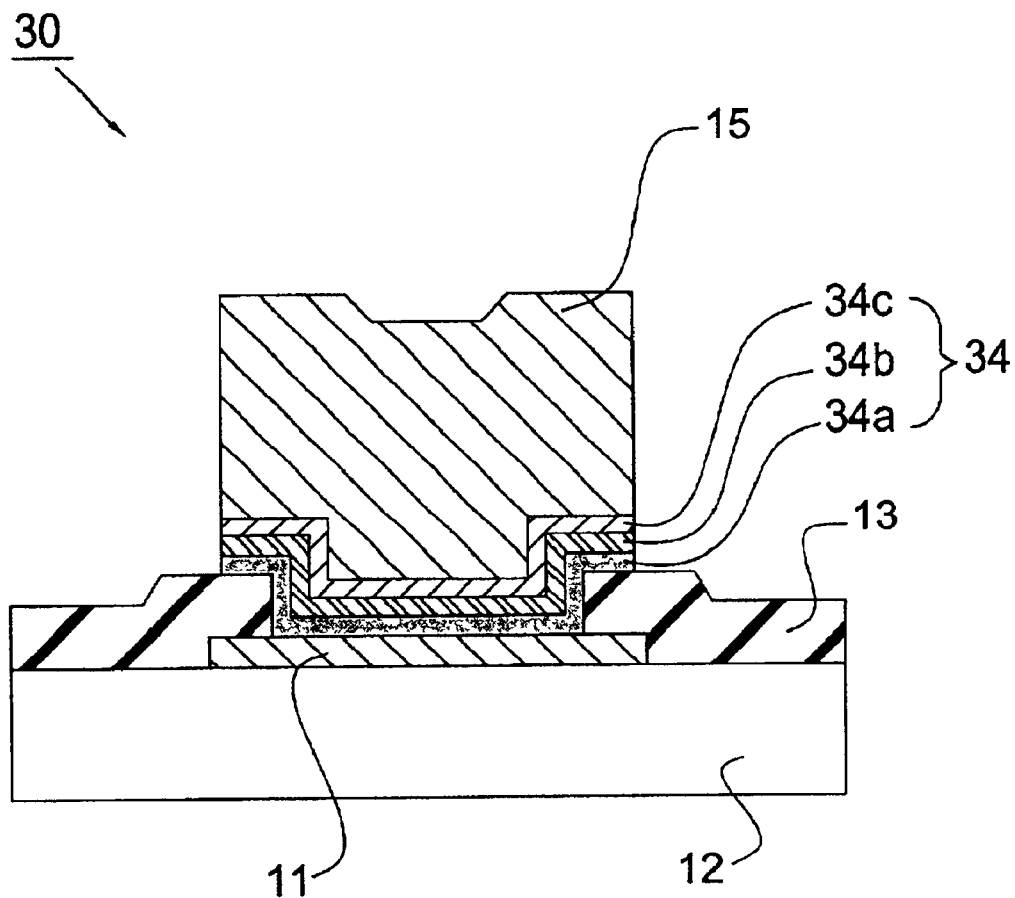
FIG. 3 is a schematic sectional view of still another conventional semiconductor device having a bump electrode.
Figure 4:
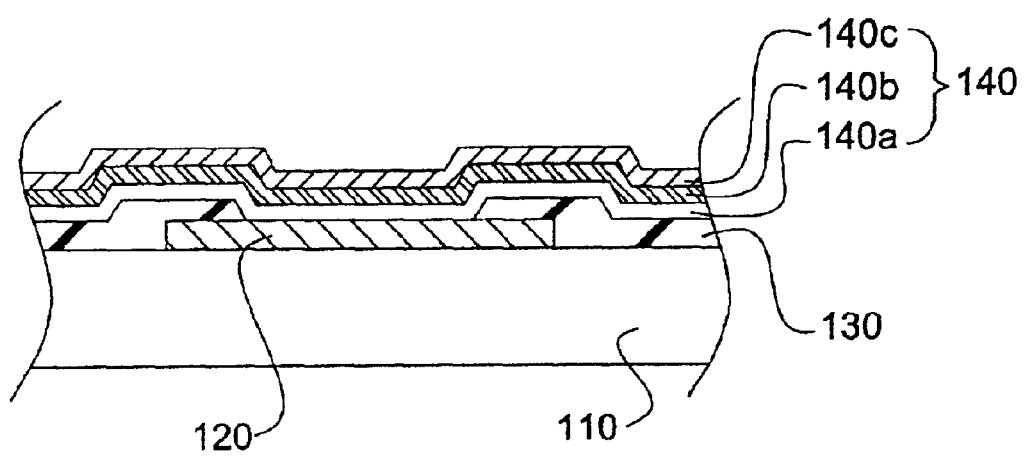
FIGS. 4 and 5 illustrate in cross-section major steps of fabrication of a semiconductor device having a bump electrode according to a preferred embodiment of the present invention.
Figure 5:
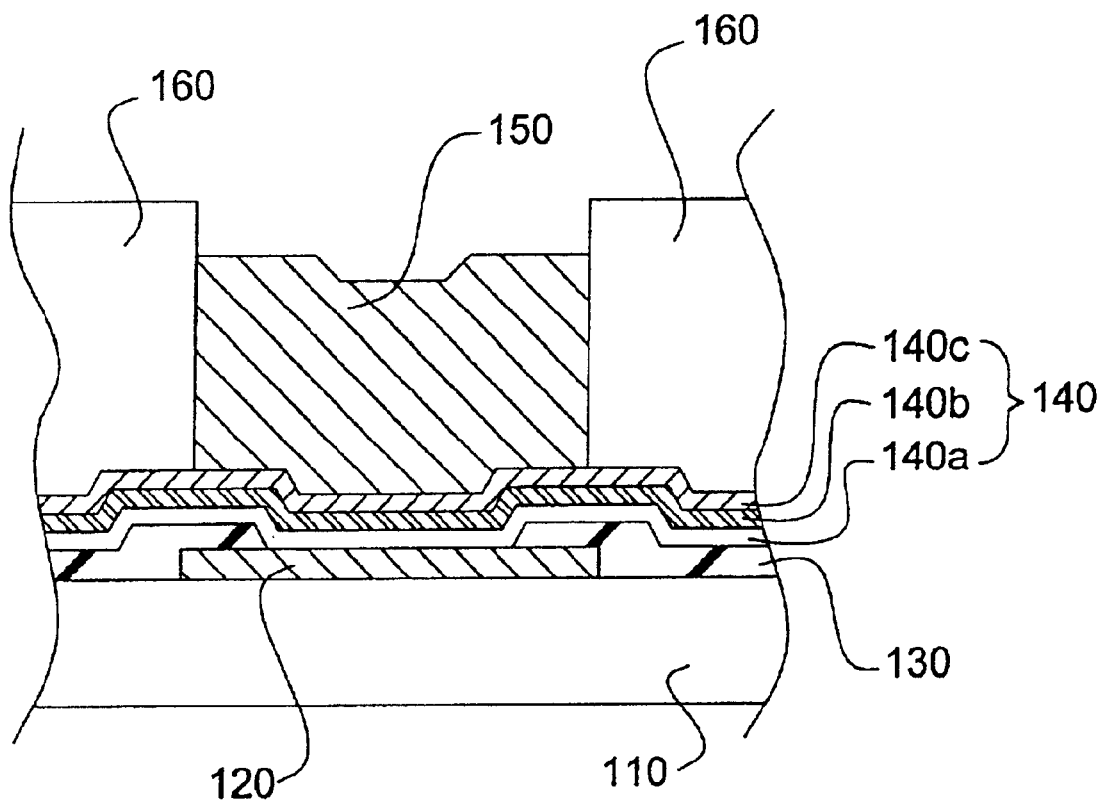

FIGS. 4 and 5 illustrate the major steps in the manufacture of a semiconductor device having a bump electrode according to a preferred embodiment of the present invention.

FIG. 4 shows a semiconductor device including a substrate 110, an aluminum contact pad 120, and a dielectric layer such as passivation layer 130. The substrate 110 may comprise a layer of a semiconducting material such as silicon, gallium arsenide, silicon carbide, diamond, or other substrate materials known to those having skill in the art. The passivation layer 130 is preferably a polyimide layer but can alternately be a silicon dioxide layer, a silicon nitride layer, or layers of other passivation materials known to those having skill in the art. As shown, the passivation layer 130 preferably covers the top edge portion of the aluminum contact pad 120 opposite the substrate 110, leaving the central surface portion of the aluminum contact pad 120 exposed from the passivation layer 130. The under bump metallurgy (UBM) 140 of the present invention comprises an aluminum layer 140a formed on the portion of the aluminum contact pad 120 exposed from the passivation layer 130, a nickel-vanadium layer 140b formed on the aluminum layer 140a and a titanium layer 140c formed on the nickel-vanadium layer 140b. The UBM 140 of the present invention chooses the aluminum layer 140a as the adhesion layer to provide a good adhesion to the aluminum contact pad 120 and the passivation layer 130. Furthermore, the UBM 140 utilizes the titanium layer 140c instead of the conventional gold layer as a wetting layer; hence, the manufacturing cost is reduced by utilizing a cheaper titanium target in the sputtering process. The UBM 140 of the present invention is preferably formed by a subtractive process.

As shown in FIG. 4, the aluminum layer 140a, the nickel-vanadium layer 140b and the titanium layer 140c are respectively sputtered on the passivation layer 130 and the exposed portions of the aluminum contact pad 120.

FIG. 5 shows a gold bump 150 being disposed on the UBM 140 over the aluminum contact pad 120 to act as a bump electrode. Specifically, the gold bump 150 is formed by the following steps: (a) Application of a photoresist 160 on UBM 140 and its patterning to form opening at a location corresponding to the pad 120; and (b) Electrodeposition of gold on the resist opening section to form the gold bump 150. Typically, the gold bump 150 comprises at least about 90 weight percentage of Au.

Since TiO or $TiO_2$ may be formed on the surface of the titanium layer due to the oxidation of titanium, it is preferable to remove the TiO or $TiO_2$ with a cleaning medium before the electrodeposition of the gold bump so as to assure a good adhesion between the gold bump and the UBM thereby improving electrical performance. Preferably, the cleaning medium is HCl.

Furthermore, the UBM 140 of the present invention is characterized by utilizing the nickel-vanadium layer 140b as a barrier layer. Since the electrical conductivity of the nickel-vanadium is lower than copper, palladium, or platinum, the influence imposed by I/Os of the semiconductor substrate 110 on the current density during the plating process of the gold bump is significantly reduced, thereby maintaining the bump height uniformity and the uniformity of bump surface roughness.

Figure 6:
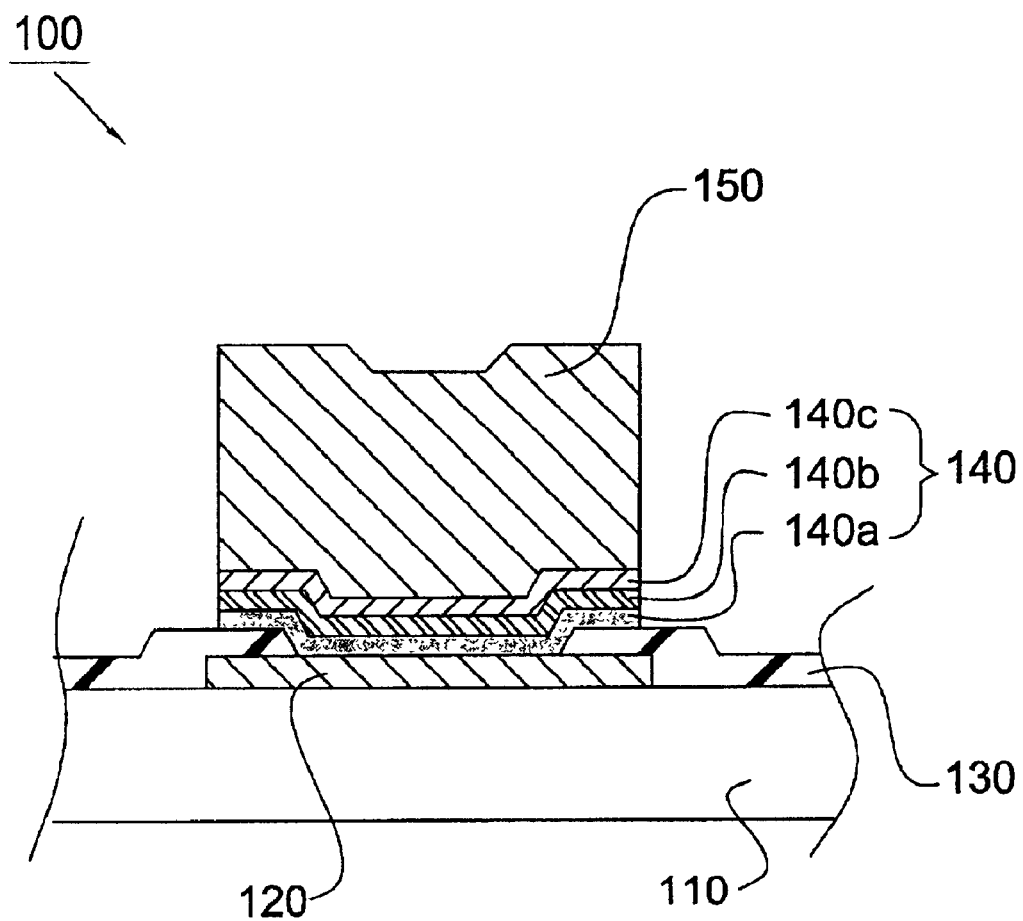
FIG. 6 is a schematic sectional view of a semiconductor device having a bump electrode according to the preferred embodiment of the present invention.

Referring to FIG. 5, after the gold bump 150 is formed on the UBM 140, the UBM 140 is etched with the plated gold bump 150 as a mask thereby obtaining the semiconductor device 100 having a bump electrode as shown in FIG. 6. The titanium layer 140c of UBM 140 can be selectively etched by acidic solution such as HCl. Since the gold bump 150 is quite resistant to HCl etching agent, the gold bump is substantially unaffected during the etching process of UBM 140 thereby obtaining a good uniformity in bump height and bump surface roughness. This significantly enhances the yield of proceeding processes.

Although the invention has been explained in relation to its preferred embodiment, it is to be understood that many other possible modifications and variations can be made without departing from the spirit and scope of the invention as hereinafter claimed.

What is claimed is:

1. A method of forming a semiconductor device having a bump electrode, the method comprising the steps of:

providing an aluminum contact pad on a substrate, at least a portion of the aluminum contact pad being exposed through a dielectric layer on the substrate;

forming an aluminum layer on the dielectric layer and the portion of the aluminum contact pad exposed through the dielectric layer;

forming a nickel-vanadium layer on the aluminum layer;

forming a titanium layer on the nickel-vanadium layer;

selectively forming a gold bump on the titanium layer at a location corresponding to the aluminum contact pad; and etching the aluminum layer, the nickel-vanadium layer and the titanium layer using the gold bump as a mask wherein the gold bump is substantially unaffected during the etching step;

said method further comprising, before the gold bump is formed on the titanium layer, the step of removing TiO or $TiO_2$ that may have been formed on the titanium layer.

2. The method as claimed in claim 1, wherein the removing step is conducted by treating the titanium layer with a cleaning medium.

3. The method as claimed in claim 2, wherein the cleaning medium is HCl.

4. A method of forming a semiconductor device having a bump electrode, the method comprising the steps of:

provide an aluminum contact pad on a substrate, at least a portion of the aluminum contact pad being exposed through a dielectric layer on the substrate;

forming an aluminum layer on the dielectric layer and the portion of the aluminum contact pad exposed through the dielectric layer;

forming a nickel-vanadium layer on the aluminum layer;

forming a titanium layer on the nickel-vanadium layer;

selectively forming a gold bump on the titanium layer at a location corresponding to the aluminum contact pad; and etching the aluminum layer, the nickel-vanadium layer and the titanium layer using the gold bump as a mask wherein the gold bump is substantially unaffected during the etching step;

wherein said etching comprises utilizing an acidic solution as an etchant to etch the aluminum layer, the nickel-vanadium layer and the titanium layer without significantly affecting the gold bump being used as an etching mask.

5. A method of forming a semiconductor device having a bump electrode, the method comprising the steps of:

providing an aluminum contact pad on a substrate, at least a portion of the aluminum contact pad being exposed through a dielectric layer on the substrate;

forming an aluminum layer on the dielectric layer and the portion of the aluminum contact pad exposed through the dielectric layer;

forming a nickel-vanadium layer on the aluminum layer;

forming a titanium layer on the nickel-vanadium layer;

selectively forming a gold bump on the titanium layer at a location corresponding to the aluminum contact pad; and etching the aluminum layer, the nickel-vanadium layer and the titanium layer using the gold bump as a mask wherein the gold bump is substantially unaffected during the etching step;

wherein said etching comprises utilizing HCl as an etchant to etch the aluminum layer, the nickel-vanadium layer and the titanium layer.

* * * * *